US010319905B2

(12) United States Patent
Hurley et al.

(10) Patent No.: US 10,319,905 B2
(45) Date of Patent: Jun. 11, 2019

(54) METHOD AND SYSTEM FOR PERFORMING POST-ETCH ANNEALING OF A WORKPIECE

(71) Applicant: Tokyo Electron Limited, Minato-ku, Tokyo (JP)

(72) Inventors: David F. Hurley, Dublin (IE); Doni Parnell, Albany, NY (US); Shigeru Tahara, Auderghem (BE); Toru Ishii, Dublin (IE)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/594,378

(22) Filed: Jan. 12, 2015

(65) Prior Publication Data

US 2015/0214473 A1    Jul. 30, 2015

Related U.S. Application Data

(60) Provisional application No. 61/931,009, filed on Jan. 24, 2014.

(51) Int. Cl.
*H01L 43/12* (2006.01)

(52) U.S. Cl.
CPC .................. *H01L 43/12* (2013.01)

(58) Field of Classification Search
CPC .............. H01L 43/12; H01L 43/08
See application file for complete search history.

(56) References Cited

U.S. PATENT DOCUMENTS

| 4,925,700 A * | 5/1990 | Brezoczky ............... G11B 5/85 427/128 |
| 6,833,107 B2 | 12/2004 | Kuriyama et al. |
| 2006/0030165 A1 | 2/2006 | Ingle et al. |
| 2006/0291830 A1 | 12/2006 | Yoo |

(Continued)

FOREIGN PATENT DOCUMENTS

| JP | 2009-539231 A | 11/2009 |
| TW | 564442 B | 12/2003 |

OTHER PUBLICATIONS

Notification of Examination Opinions dated Feb. 18, 2016 in corresponding Taiwan Patent Application No. 104102188 (with an English translation) (15 pages).

(Continued)

*Primary Examiner* — Julia Slutsker
(74) *Attorney, Agent, or Firm* — Rothwell, Figg, Ernst & Manbeck, P.C.

(57) ABSTRACT

A method for performing post-etch annealing of a workpiece in an annealing system is described. In particular, the method includes disposing one or more workpieces in an annealing system, each of the one or more workpieces having a multilayer stack of thin films that has been patterned using an etching process sequence to form an electronic device characterized by a cell critical dimension (CD), wherein the multilayer stack of thin films includes at least one patterned layer containing magnetic material. Thereafter, the patterned layer containing magnetic material on the one or more workpieces is annealed in the annealing system via an anneal process condition, wherein the anneal process condition is selected to adjust a property of the patterned layer containing magnetic material.

20 Claims, 6 Drawing Sheets

(56) References Cited

U.S. PATENT DOCUMENTS

| | | | |
|---|---|---|---|
| 2007/0187386 A1 | 8/2007 | Kim et al. | |
| 2008/0062581 A1* | 3/2008 | Parkin | B82Y 10/00 |
| | | | 360/324.11 |
| 2011/0233700 A1* | 9/2011 | Hayakawa | B82Y 25/00 |
| | | | 257/421 |
| 2011/0303997 A1* | 12/2011 | Wang | B82Y 25/00 |
| | | | 257/421 |
| 2012/0049843 A1* | 3/2012 | Sun | G01R 33/098 |
| | | | 324/249 |
| 2012/0058575 A1* | 3/2012 | Horng | G01R 33/098 |
| | | | 438/3 |
| 2012/0068285 A1* | 3/2012 | Kitagawa | H01F 10/3286 |
| | | | 257/421 |
| 2012/0326250 A1 | 12/2012 | Gaidis et al. | |
| 2014/0061828 A1* | 3/2014 | Lim | H01L 43/08 |
| | | | 257/421 |
| 2014/0292312 A1* | 10/2014 | Chen | G01R 33/098 |
| | | | 324/207.21 |
| 2015/0031146 A1* | 1/2015 | Mani | H05B 6/10 |
| | | | 438/3 |

OTHER PUBLICATIONS

International Search Report and Written Opinion dated Apr. 28, 2015 in PCT/US2015/010985 (13 pages).
International Preliminary Report on Patentability and Written Opinion dated Jul. 26, 2016 in PCT/US2015/010985 (7 pages).
Office Action dated Nov. 21, 2016 in corresponding Taiwan Patent Application No. 104102188 (with an English translation) (16 pages).

* cited by examiner

METHOD AND SYSTEM FOR PERFORMING POST-ETCH ANNEALING OF A WORKPIECE

CROSS-REFERENCE TO RELATED APPLICATIONS

Pursuant to 37 C.F.R. § 1.78(a)(4), this application claims the benefit of and priority to U.S. Provisional Application No. 61/931,009 filed on Jan. 24, 2014, which is expressly incorporated by reference herein in its entirety.

BACKGROUND OF THE INVENTION

Field of Invention

The invention relates to a method for annealing a microelectronic workpiece, and in particular, a method for annealing one or more layers containing magnetic material on a microelectronic workpiece.

Description of Related Art

Magnetic annealing is one of three processes required to manufacture magnetoresistive random access memory (MRAM) devices compatible with conventional complementary metal oxide semiconductor (CMOS) logic based microelectronic workpieces. To successfully anneal a workpiece, the ferromagnetic layer must be held at a predetermined temperature in a magnetic field for a period of time long enough for the crystals to orient themselves in a common direction upon cooling. This process, which is also referred to as "soak" is carried out in an inert, reducing, or vacuum environment to prevent oxidation of the workpieces, while they are held at the predetermined temperature.

Magnetic annealing equipment generally operates in batch-mode, i.e., plural workpieces are annealed at the same time, and performs a sequence of steps. As an example, these steps include heating, soaking, and cooling the workpieces in the presence of a magnetic field, typically between 0.02 and 7.0 T (Tesla). The cost of MRAM device manufacturing is linked to the magnetic annealing tools, where the productivity (acceptable devices produced per hour) is the product of density (number of devices per workpiece), throughput (workpieces per hour), and yield (ratio of acceptable devices to total number of devices processed), as dictated by the overall thermal/anneal cycle.

Conventionally, magnetic annealing is performed prior to the patterning of the multilayer stack, within which the MRAM device is fabricated. However, as technology nodes advance with ever-decreasing node size, damage resulting from the etching process used to pattern the multilayer stack dramatically reduces yield of acceptable devices.

SUMMARY OF THE INVENTION

Embodiments of the invention relate to a method for annealing a microelectronic workpiece, and in particular, a method for annealing one or more layers containing magnetic material on a microelectronic workpiece.

According to one embodiment, a method for performing post-etch annealing of a workpiece in an annealing system is described. In particular, the method includes disposing one or more workpieces in an annealing system, each of the one or more workpieces having a multilayer stack of thin films that has been patterned using an etching process sequence to form an electronic device characterized by a cell critical dimension (CD), wherein the multilayer stack of thin films includes at least one patterned layer containing magnetic material. Thereafter, the patterned layer containing magnetic material on the one or more workpieces is annealed in the annealing system via an anneal process condition that includes: (1) elevating a temperature of the one or more workpieces relative to ambient temperature, or (2) exposing the one or more workpieces to a magnetic field, or (3) performing both the elevating the temperature of the one or more workpieces and the exposing the one or more workpieces to a magnetic field, wherein the anneal process condition is selected to adjust a property of the patterned layer containing magnetic material.

According to another embodiment, a method for performing post-etch annealing of a microelectronic workpiece in an annealing system is described. The method includes: following an etching process sequence used to pattern a multilayer stack of thin films on a workpiece that includes a patterned layer containing magnetic material, annealing the patterned layer containing magnetic material to transition a composition of the patterned layer containing magnetic material from a substantially amorphous phase to a substantially crystalline phase, and produce a desired anisotropy direction in or at the surface of the patterned layer containing magnetic material.

DETAILED DESCRIPTION OF SEVERAL EMBODIMENTS

Methods for annealing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Figure 1:
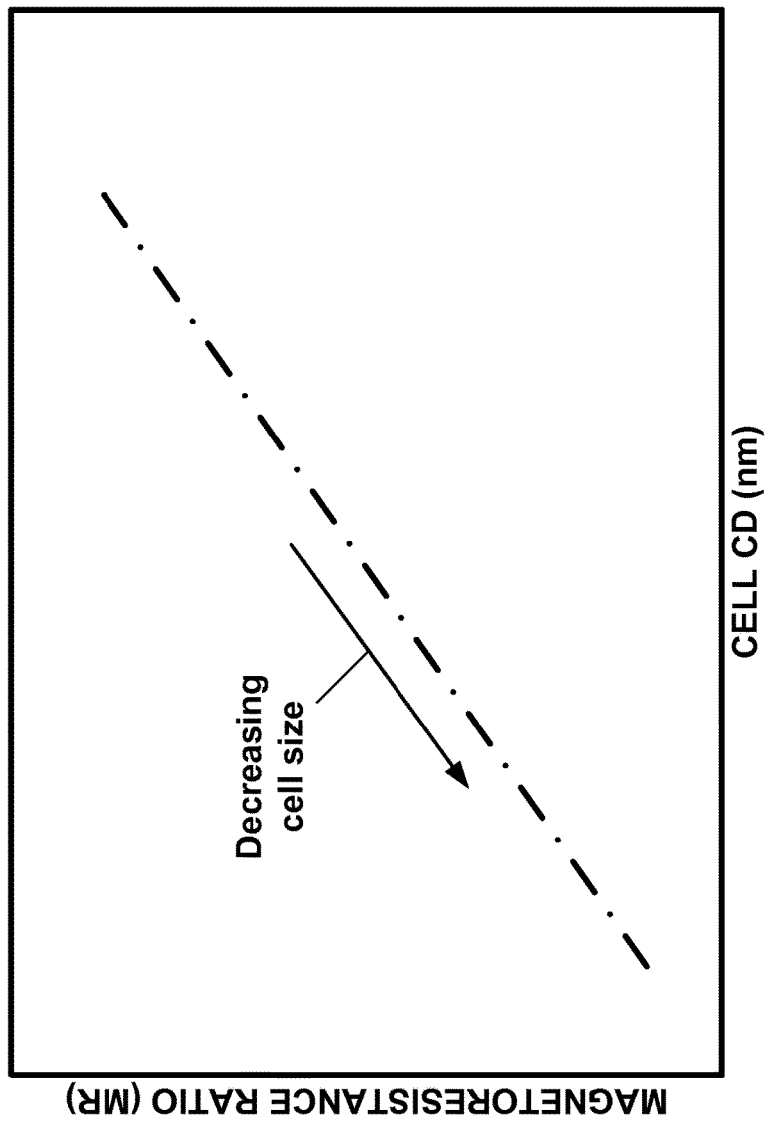
FIG. 1 is a schematic illustration of the relationship between magnetoresistive ratio (MR) and cell critical dimension (CD)

As briefly described above, with the advancement from one technology node to the next, the performance of magnetic-based resistance switching cells has been shown to degrade with decreasing cell size, or cell critical dimension (CD), when using conventional annealing procedures. As an example, FIG. 1 provides a typical relationship between the magnetoresistance ratio (MR) and cell CD (nm, nanometers) observed during fabrication of MRAM devices. The MR, which is commonly used to characterize device performance, may be defined as the difference in resistance between parallel and anti-parallel magnetic states normalized by the resistance for a parallel magnetic state. For robust device performance, it is important that the MR be maximized.

In conventional annealing, the blanket layers of the multilayer stack are formed on the workpiece, the one or more layers containing magnetic material are annealed, and thereafter, the multilayer stack is patterned using a sequence of etching processes to achieve a target CD for the cell, i.e., cell CD. The inventor suspects that damage, e.g., magnetic, structural, and/or chemical damage, incurred at the edge of the multilayer stack, and particularly within the edge region of the one or more annealed layers containing magnetic material, adversely affects the MR for the resultant patterned cell. And, the effect of the etch damage becomes more acute with decreasing cell CD.

Figure 2:
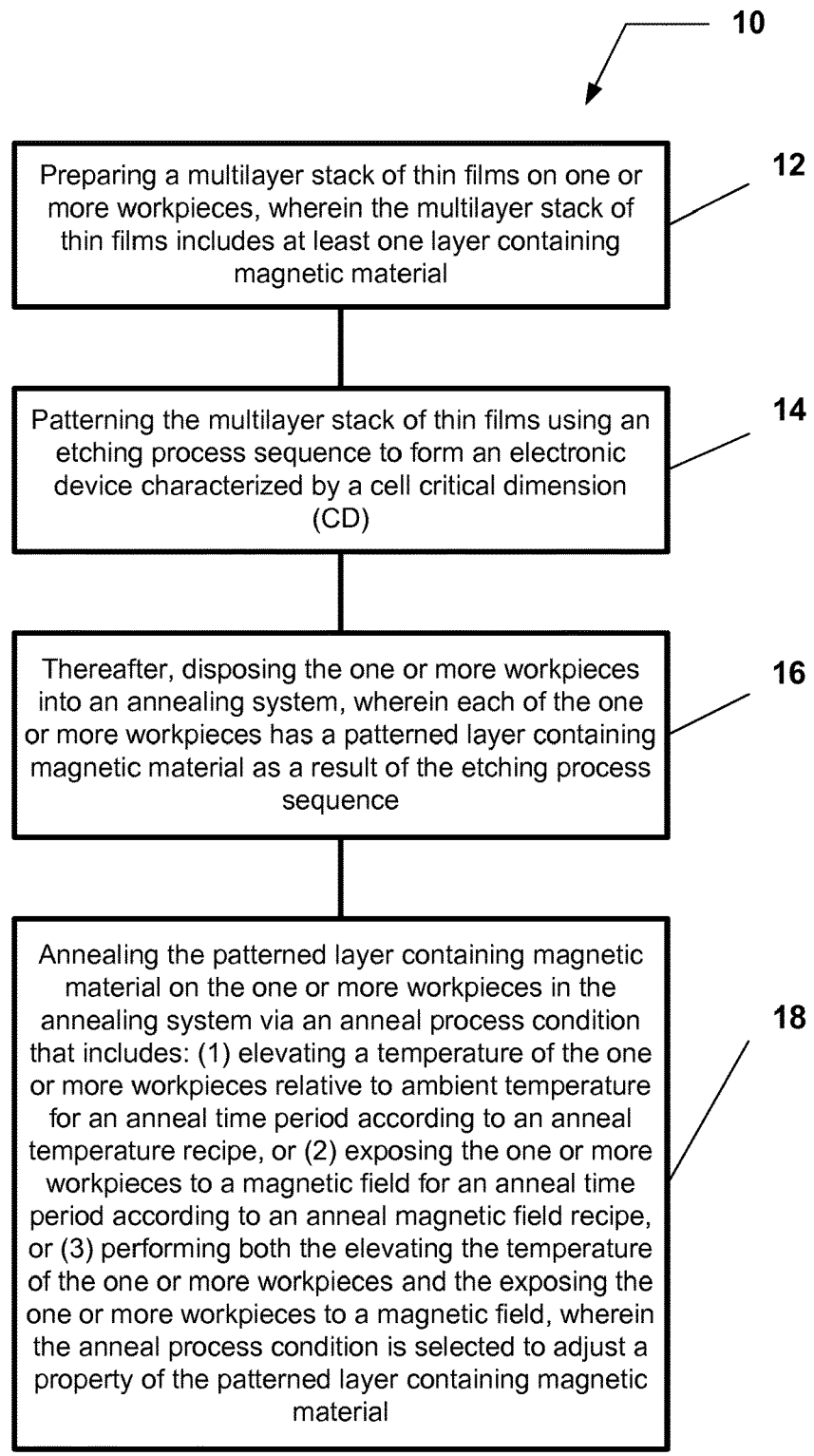
FIG. 2 provides a flow chart presenting a method of annealing a microelectronic workpiece in an annealing system according to an embodiment.

Therefore, referring now to the drawings, wherein like reference numerals designate identical or corresponding parts throughout the several views, FIG. 2 illustrates a method for performing post-etch annealing of a workpiece in an annealing system according to an embodiment. The method is illustrated in a flow chart 10, and begins in 12 with preparing a multilayer stack of thin films on one or more workpieces, wherein the multilayer stack of thin films includes at least one layer containing magnetic material.

The multilayer stack may include any material suitable for fabricating a microelectronic device, such as a memory cell depending on layers containing magnetic material for either the basis of its information storage or switching of its memory state(s). These devices may include, but not be limited to, magnetoresistive random access memory (MRAM), current switching toggle magnetic structures, magnetic tunnel junction (MTJ) devices, spin torque transfer (STT) devices, spin valves, and pseudo-spin valves. Exemplary materials may include metals, such as Ru, Co, Fe, Pt, Ta, Ir, Mn, etc., and metal alloys, such as NiFe, CoFe, etc. And, these materials may be deposited using any suitable method, such as sputtering, physical vapor deposition (PVD), chemical vapor deposition (CVD), atomic layer deposition (ALD), and plasma-assisted variations thereof, for example.

At the core, however, the multilayer stack includes one or more layers containing magnetic material. The layer containing magnetic material may include ferromagnetic and/or anti-ferromagnetic materials. As an example, a microelectronic device having a magnetic tunnel junction (MTJ) can include two electrode layers composed of a ferromagnetic material and separated by a thin tunneling barrier, such as magnesium oxide or aluminum oxide. When the magnetic moments of the two electrode layers are oriented parallel to one another, the resistance to current flow across the magnetic tunnel junction is relatively low. And conversely, when the magnetic moments of the two electrode layers are oriented antiparallel to one another, the resistance to current flow across the magnetic tunnel junction is relatively high. The resultant microelectronic device may be based on the switching of these two resistive states, the performance of which may be characterized by the MR, as described above.

In 14, the multilayer stack of thin films is patterned using an etching process sequence to form an electronic device characterized by a cell critical dimension (CD). The cell CD may include a first dimension in a first lateral direction, and a second dimension in a second lateral direction, generally orthogonal to the first lateral direction. The etching process sequence may include a dry etching process, or a wet etching process, or both. Furthermore, the etching process sequence may include a plasma etching process, or a non-plasma etching process, or both. And further yet, for example, the etching process sequence may include reactive ion etching (RIE), ion milling, gas cluster ion beam (GCIB) etching, etc.

Thereafter, in 16, the one or more workpieces are disposed within an annealing system, wherein each of the one or more workpieces includes a patterned layer containing magnetic material as a result of the etching process sequence. As will be described in greater detail below, the annealing system may include any one of the embodiments presented in FIGS. 3 and 4.

And, in 18, the patterned layer containing magnetic material on the one or more workpieces is annealed in the annealing system via an anneal process condition that includes: (1) elevating a temperature of the one or more workpieces relative to ambient temperature for an anneal time period according to an anneal temperature recipe, or (2) exposing the one or more workpieces to a magnetic field for an anneal time period according to an anneal magnetic field recipe, or (3) performing both the elevating the temperature of the one or more workpieces and the exposing the one or more workpieces to a magnetic field, wherein the anneal process condition is selected to adjust a property of the patterned layer containing magnetic material.

The anneal process condition is selected to adjust a property of the patterned layer containing magnetic material. The property of the patterned layer containing magnetic material may include crystallization, uniaxial anisotropy, magnetoresistance ratio (MR), or resistance area product, or a combination of two or more thereof. As an example, the annealing may be performed to transition a composition of the patterned layer containing magnetic material from a substantially amorphous phase to a substantially crystalline phase, and produce a desired anisotropy direction in or at the surface of the patterned layer containing magnetic material.

According to embodiments described herein, the annealing of the layer containing magnetic material is performed after the patterning of the multilayer stack is completed. In doing so, the inventor surmises that the annealing process may rectify or partially rectify the regions damaged by the etching process sequence. The annealing of the layer containing magnetic material may include elevating a temperature of the layer containing magnetic material, or imposing a magnetic field on the layer containing magnetic material, or both elevating a temperature of the layer containing magnetic material and imposing a magnetic field on the layer containing magnetic material.

The anneal process condition may include setting and adjusting one or more process parameters for controlling the annealing process. The one or more process parameters may include an anneal temperature for thermally treating the one or more workpieces when the one or more workpieces require annealing at an elevated temperature, the anneal time period for performing the annealing process, the gaseous composition of the process environment within which the one or more workpieces are annealed, the pressure within the annealing system, the field strength of an imposed magnetic field when the one or more workpieces require annealing in a magnetic field, etc.

During annealing, the anneal temperature of the one or more workpieces may be elevated according to an anneal temperature recipe that includes a peak temperature ranging from about 200 degrees C. to about 600 degrees C. For example, the peak temperature may range from about 250 degrees C. to about 350 degrees C. The anneal time period may range up to about 100 hours. For example, the anneal time period may range from about 1 second to about 10 hours.

Furthermore, during annealing, the one or more workpieces may be exposed to a magnetic field according to an anneal magnetic field recipe that includes a field strength ranging up to 5 T. For example, the magnetic field may have a field strength ranging up to 2 T. The anneal time period may range up to about 100 hours. For example, the anneal time period may range from about 1 second to about 10 hours.

Figure 3:
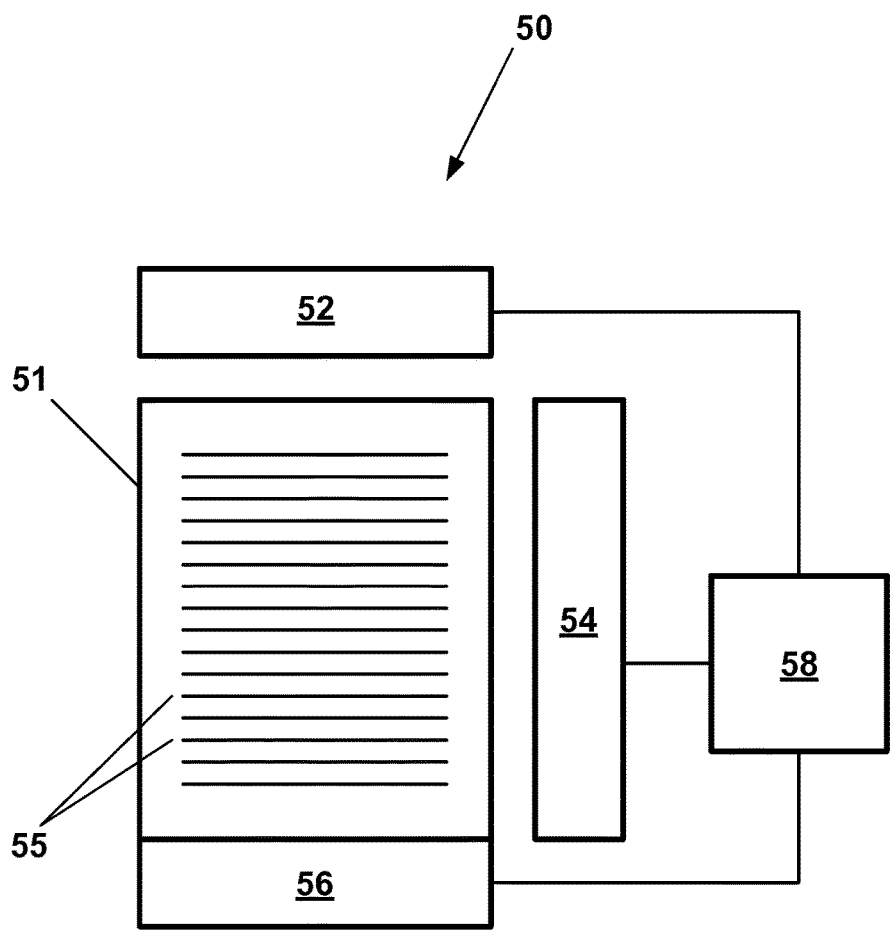
FIG. 3 provides schematic illustration of an annealing system according to an embodiment.

According to one embodiment, FIG. 3 provides a schematic illustration of an annealing system 50. Annealing system 50 includes a process chamber 51 within which one or more workpieces 55 may be loaded and arranged in various orientations upon a workpiece holder (not shown). The process chamber 51 may be sealed and evacuated to a reduced pressure relative to ambient pressure using pumping system 56. A process gas may or may not be introduced to the process chamber 51 at a predetermined flow rate from a gas source (not shown).

Furthermore, the annealing system 50 includes a temperature control system 52 arranged proximate to or surrounding the process chamber 51 and configured to controllably adjust the temperature of the one or more workpieces 55 to a predetermined value or sequence of values of temperature. The temperature control system 52 may include one or more arrays of heating elements arranged around or adjacent to the process chamber 51 (e.g., arranged to surround the process chamber 51), and configured to heat and cool the one or more workpieces according to an anneal temperature recipe. For example, the one or more arrays of heating elements may include one or more resistive heating elements, one or more heated or cooled fluid conduits or jackets, one or more radiation sources (e.g., infrared (IR) source/lamp, ultraviolet (UV) source/lamp, etc.), etc.

Further yet, the annealing system 50 may include a magnet system arranged proximate to the process chamber 51 and configured to generate a magnetic field of a predetermined magnetic field strength and orientation within the interior of the process chamber 50. The magnet system may include one or more magnets arranged in a solenoidal or Helmholtz configuration around or adjacent the process chamber 51. For example, the magnet system may include a superconducting magnet, an electromagnet, or a permanent magnet, or a combination of two or more thereof.

As shown in FIG. 3, the annealing system 50 may also include a controller 58 coupled to the temperature control system 52, the magnet system 54, and the pumping system 56, and configured to send and receive programmable instructions and data to and from the components of the annealing system 50. For example, the controller 58 may be programmed to control the anneal temperature of the workpiece, the anneal time period, the magnetic field strength, the pressure in the process chamber 51, the process gas flow rate (if any) delivered to the process chamber 51, and the temporal and/or spatial variation of any of these process parameters.

Figure 4:
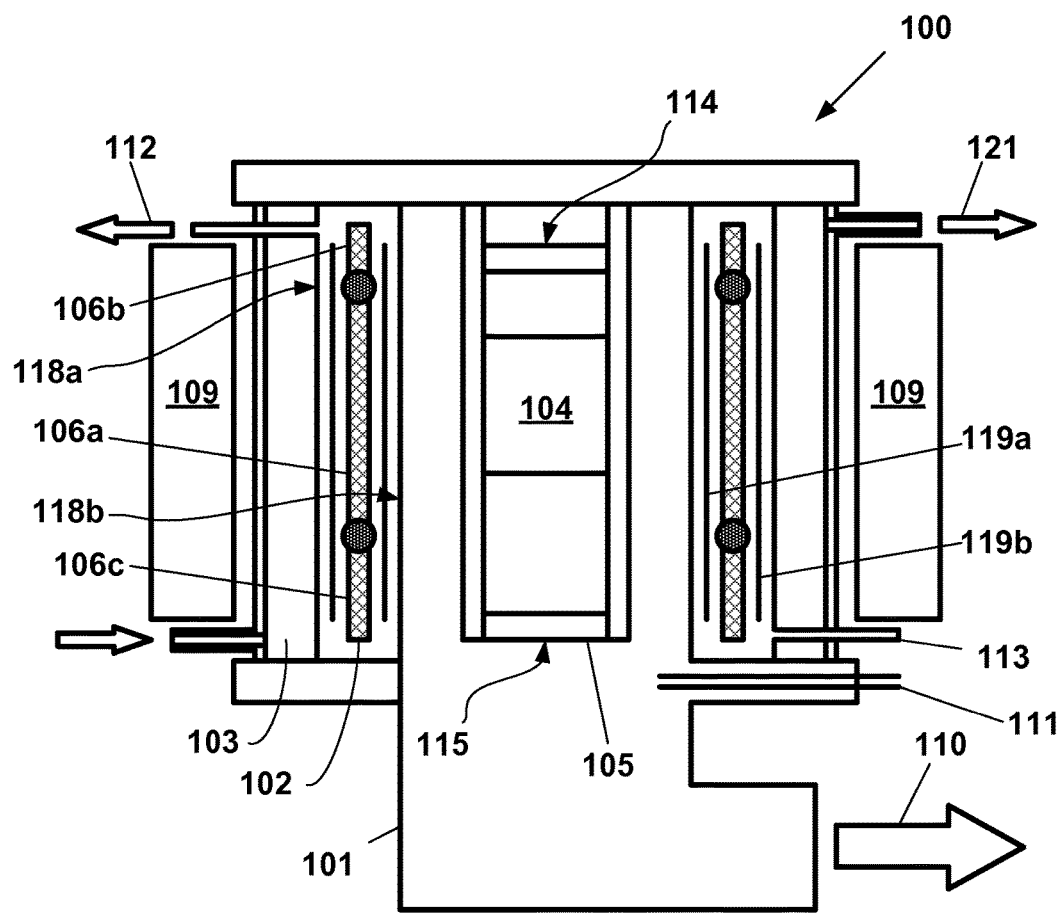
FIG. 4 provides schematic illustration of an annealing system according to another embodiment.

According to another embodiment, FIG. 4 provides a schematic illustration of an annealing system 100. Annealing system 100 includes a process chamber 101 arranged to receive and hold a plurality of workpieces 104 during the thermal/anneal cycle. It will be understood by those skilled in the art that the workpieces can be semiconductor substrates, wafers, MRAM devices/chips, giant magneto resistance (GMR) heads, hard disc drives, and any other device which may be annealed at an elevated temperature with or without a magnetic field present. Workpieces may include, for example, semiconductor wafers used in the manufacture of MRAM devices, wafers used in the manufacture of MTJ devices, GMR sensors, magnetization of metallic objects at elevated temperatures, degaussing of magnetic thin films, and other objects that require annealing under the influence of magnetic fields.

The workpieces may be held on a rack or similar apparatus. If the workpieces are semiconductor wafers, they will preferably be placed at a variable pitch of about 2 mm to about 10 mm, when wafers are processed, in order to effectively perform the thermal cycle. Process chamber 101 is connected via evacuation line 110 to a pumping system for evacuating the process chamber and creating vacuum therein. The pumping system may include a vacuum pump, and/or roughing pump, which is capable of drawing a vacuum in the range of $10^{-8}$ to 100 Torr. In an exemplary embodiment, the roughing pump is utilized in series with a vacuum pump. The roughing pump is employed to draw a vacuum to about $10^{-3}$ Torr, while the vacuum pump is subsequently employed to further reduce the vacuum pressure to $10^{-7}$ Torr or lower. The roughing pump can be selected from among an oil sealed pump or dry pump, while the high or hard vacuum pump can be selected from among, turbomolecular pumps, diffusion pumps, cryo-pumps, or any other device capable of drawing the requisite vacuum.

At least partially surrounding process chamber 101 is a temperature control system that includes an element chamber 102 having a number of heating assembly zones (106a-106c) therein, which can be independently monitored and controlled. In a particular embodiment, the element chamber 102 can be sealed within the chamber walls 118a and 118b of process chamber 101. Element chamber 102, although sealed, is nonetheless fluidly connected to a means for drawing a vacuum within the element chamber 102. The means for drawing vacuum can include any one or more of the pumps described above with respect to process chamber 101. Separately, a heat transfer gas can be introduced into the element chamber 102. On the outer periphery of wall 118a, a cooling chamber/jacket 103 is disposed to remove heat from the process chamber 101 upon completing any one of the heating steps carried out in the anneal cycle/process.

A magnet system 109 is disposed on the outer periphery of cooling chamber 103 to obtain a magnetic field ranging from about 0.02 to 7.0 T (Tesla) within the process chamber 101. The means for generating a magnetic field may include a permanent magnet, a superconducting, and/or an electromagnet.

In an exemplary embodiment, and referring back to FIG. 4, element chamber 102 is connected to a pump, such as a turbo pump (not shown), which is capable of drawing or pulling a hard vacuum through line 112, that is to a pressure sufficiently low to effectively reduce gas conduction, i.e., the thermal conductivity of the intervening gas medium and thereby reduce conduction from the heat elements to the inner wall of the cooling chamber. An exemplary pressure level which is suitable in the element chamber 102 to reduce gas conduction during heating would be on the order of $10^{-4}$ Torr. The element chamber 102 is also fluidly connected to a supply of cooling gas via line 113. When cooling gas is supplied to the element chamber 102, the pressure in the element chamber 102 increases such that gas conduction heat transfer, and to some extent convective heat transfer, are increased. The rate of heat transfer to the cooling chamber 103 is increased by about 3-20 times over the heat transfer rate when the element chamber 102 is held under vacuum.

In a further exemplary embodiment, the drawing of vacuum and the withdrawal of cooling gas can be accomplished via a single line. The gas supplied can be selected from among helium, nitrogen, argon, compressed dry air, and mixtures thereof. Preferably, the cooling gas is helium because of its relatively high thermal conductivity and specific heat capacity. The pressure, flow, and composition of the gas in the element chamber may each be varied independently of the process chamber. The cooling rate is independent of gas flow in a range of about 1-100 slpm (standard liters per minute), and a gas pressure of 1-1000 Torr. The composition is varied by utilizing one or more gas sources in fluid communication with the element chamber 102, via a manifold to introduce the gases into either the element chamber 102 or the process chamber 101.

A suitable means for controlling the pressure (vacuum level) in the element chamber 102 and separately in the process chamber 101 includes upstream pressure control using various gas flow (loads), or downstream pressure control using a throttle valve on the vacuum foreline to vary the effective pumping speed being delivered to the process chamber 101. A typical pressure control system may include a pressure sensor, a PID (proportional-integral-derivative) controller and a control element, such as a flow control valve. Upstream pressure control can be achieved by way of a gas flow capacitance manometer, such as a BARATRON™, or a mass flow meter used to measure the gas inlet flow or the chamber pressure. The signal from the measuring device is fed to the PID controller, which compares the measured pressure or flow to the desired set point, and adjusts the gas flow control valve accordingly. Downstream pressure control is achieved using a throttle valve on the vacuum foreline to vary the effective pumping speed being delivered to the process chamber 101. For pressure control with multiple gas sources, multiple mass flow controllers are slaved to a master PID controller which regulates either pressure or flow. The master PID controller adjusts the total flow to achieve the desired pressure, while the mass flow controller adjusts the flow of each individual gas to select between the gas sources and obtain the desired gas composition.

Hence, it is possible to supply a gas to the element chamber 102 at a pressure corresponding to rough or soft vacuum, while process chamber 101 is maintained in a hard vacuum condition. Conversely, it is possible to hold a hard vacuum in element chamber 102, while a gas such as helium is introduced into process chamber 101 at a pressure corresponding to rough or soft vacuum.

More particularly, process chamber 101 is independently controlled from element chamber 102. Process chamber 101 is connected to a vacuum pump, such as a turbomolecular vacuum pump, via evacuation line 110. A vacuum is drawn or pulled on the process chamber 101 during a particular process step of the thermal/anneal cycle, and a gas may be introduced via line 111. As with element chamber 102, it is contemplated that the drawing of vacuum and withdrawal of gas may be accomplished via a single line.

The cooling chamber 103, disposed between the element chamber 102 and magnet system 109, is provided with cooling fluid 121 circulated through the cooling chamber 103 at a flow rate of about 5-10 liters per minute, and at a temperature of about 20 degrees C. The cooling chamber 103 is configured for maximum heat transfer efficiency when the element chamber 102, or both the element chamber 102 and the process chamber 101 are running in conduction mode (i.e., during the cooling phase of the thermal/anneal cycle), and prevents the overheating of magnet system 109 by maintaining the exterior temperature below about 35 degrees C. The cooling fluid employed in the cooling chamber 103 may include, but is not limited to, water, a 50/50 solution of water and ethylene glycol, or any fluid that provides the requisite cooling temperature. In the event ethylene glycol is used, a cooling temperature lower than 20 degrees C. can be obtained. Forced air cooling could also be used. In this case, a separate insulating layer is required between the outer wall of the cooling chamber 103 and the magnetic system 109.

In another exemplary embodiment, and with continued reference to FIG. 4, process chamber 101 includes top heat shield 114 and bottom heat shield 115, above and below the workpiece stack, respectively. Preferably, in the annealing process, the workpieces 104 are disposed in the center of the process chamber 101, roughly equidistant from the top and bottom of the process chamber 101. The heat shields 114, 115 prevent axial heat transfer between the workpiece stack and the top and bottom of the process chamber 101. These heat shields 114, 115 should be non-magnetic, and preferably, have a heat reflective surface with an emissivity of 0.5 or less. In particular, the heat shields are conducive to the removal of heat from the workpieces 104 in a primarily radial direction. Radial heat transfer is preferred as it promotes uniform cooling of the stack. Heat transfer between successive workpieces 104 in a stack, on the other hand, is much less efficient than conduction along a single workpiece. For example, when heat is removed axially from the top and bottom of the stack, the cooling is non-uniform since each workpiece is separated by space filled with either a vacuum or gas. These mediums provide a resistance to heat flow from the central workpiece relative to the top and bottom workpieces such that the top workpiece cools at a faster rate than the central workpiece.

Uniform heating of the workpieces can be accomplished by independently providing energy and control of the various heater elements in the element chamber 102. In one embodiment, the heater elements are divided axially into three different zones (106a-106c), wherein the center zone heater 106(b) is aligned with the workpiece stack. Two end zone heaters 106(a) and 106(c) are provided above and below the center heater, respectively, and are independently controlled. In another embodiment, the heaters can be divided azimuthally into separate zones, for instance, three heaters each covering 120 degrees. The power input to each heated zone can be varied separately to achieve uniform heating. Generally, the thermal mass of the heater elements, heat flux plates, and inner wall 118(a) should be minimized to reduce the power input for a given temperature rise, and heat removal for a given temperature drop. In other words, it is desirable for the workpieces 104 to be the largest thermal mass in the system. In this manner, the possibility of temperature non-uniformity is greatly reduced.

Likewise, the gap between 118(a) and 118(b) is kept at a minimum, as this will serve to minimize the bore necessary for the magnetic system 109, and will maximize the conductive heat transfer between the process chamber 101, the heater elements in element chamber 102, and the inner wall of the cooling chamber 103 while in conduction mode. Preferably, the heater elements are selected from an array of electrical resistance heaters sufficient to provide and maintain an anneal temperature. As utilized herein, annealing temperatures range from about 200-1000 degrees C., depending on the device being manufactured. The heater elements are wound so as to cancel out forces generated by the strong magnetic field in which they are disposed.

Process chamber 101, includes wall 118a which separates the workpieces 104 from element chamber 102. The material employed for the chamber wall 118a can be any type of material suitable for use in a semiconductor fab. Preferred materials are those with either high emissivity, high thermal conductivity, or low heat capacity, or a combination thereof. Typically, the wall 118a is manufactured from transparent 214 fused silica glass (i.e., quartz), which is partially transparent to wavelengths in the electromagnetic spectrum ranging from of 0.78 to 1000 microns (e.g., infrared spectrum), or silicon carbide which has high emissivity and thermal conductivity.

When manufacturing silicon wafers in a temperature range of 100 to 400 degrees C., for example, the transmissivity of the quartz wall or tube ranges from 5 to 12 percent. In accordance with Kirchoff's law, the emissivity of the quartz is in the range of 88 to 95 percent. The chamber wall 118a can also include stainless steel. Although stainless steel has a lower emissivity than quartz or silicon carbide, it can be made thinner thereby reducing its total heat capacity, in addition to reducing the bore of the magnet. Furthermore, stainless steel can be welded or sealed in other ways that are not possible with quartz or silicon carbide.

Chamber wall 118a surrounds the workpieces, and forms a barrier between process chamber 101 and element chamber 102. The chamber wall 118a can be in the form of a quartz tube which is sealed at both ends by means of demountable gasket seals using O-rings at the top and bottom of the process chamber 101, thereby forming separate process and element chambers 101 and 102, respectively. Additionally, the quartz tube serves to prevent contamination of the process chamber 101 and facilitates ease of cleaning.

Heater elements 106(a-c) can be arranged within the element chamber 102 and supported via a variety of well understood techniques. For example, the heater elements 106(a-c) may be arranged within the element chamber 102 so as to be positioned between and supported by heat flux plates. Alternatively, the heater elements 106(a-c) may be supported by the wall of the element chamber 102 or the wall of the process chamber 101. As defined herein, the term "heat flux plate" refers to plates that modify the heat flux emanated from the heater elements to either promote or inhibit radiant heat exchange between the heaters and process chamber 101 and the cooling chamber 103, respectively. With reference to FIG. 4, the element chamber includes heat flux plates 119(a) and 119(b), wherein heat flux plate 119(a) faces process chamber 101 and the workpieces 104 disposed therein. Heat flux plate 119a preferably has a higher emissivity than heat flux plate 119(b), which faces the cooling chamber 103. Heat flux plate 119(b) prevents the excessive heating of the cooling fluid circulating through cooling chamber 103, while heat flux plate 119(a) enhances uniform radiant heating of the workpieces 104 disposed in the process chamber 101. It will be understood that the heat flux plates may be manufactured from stainless steel, or any other material that would impart the emissivity characteristics necessary for the thermal cycle.

Heat flux plate 119(b) can further be polished so as to provide a shiny and reflective surface, facing the cooling chamber 103. Furthermore, heat flux plate 119(a), which faces the process chamber 101, should not have a reflective surface, so as to promote radiative heat exchange between itself and the wall of the process chamber 101 during the heating cycle. Typically, heat flux plate 119(b) is a polished stainless steel material having an emissivity in the range of about 0.07-0.17, while heat flux plate 119(a) is a stainless steel material having an emissivity ranging from about 0.3-0.6. The inner wall of the cooling chamber 103 is preferably polished as well to inhibit radiative heat transfer between itself and the heat flux plate 119(b) during the heating step of the thermal cycle. The result of either or both of the measures described above is that, for a given power input to the heating elements, in a radiation mode, the fraction of the supplied energy being transferred to the cooling jacket is reduced, and the fraction being transferred to the workpieces 104 is increased.

In another embodiment, the heating elements are disposed in a free standing structure, which is positioned to surround the process chamber 101. In this instance, and with reference to FIG. 4, the heating elements would be sealed in a stainless steel assembly with heater supports/walls 118(a) and 118(b), which can be evacuated or purged with gas independent of process chamber 101. The atmosphere of process chamber 101 would be in contact with the inner wall of cooling chamber 103.

In yet other embodiments, a sheet of polished stainless steel, or the like, having a cylindrical configuration may be disposed between the heat flux plate 119(b) and the inward facing surface of cooling chamber 103. Additionally, multiple sheets of a reflective material, such as polished aluminum, can be employed between the heat flux plate 119(b) and the inward facing surface of cooling chamber 103. Additionally yet, heat flux plate 119(a) may be omitted, and the element chamber 102 or the heating elements 106 (a)-(c) are positioned in contact with the wall of the process chamber 101. The heat flux pate 119(b) may be a free standing heat shield, which is not combined with the supports of the element chamber 102. The heat flux plate 119(b) may consist of multilayer insulation, and furthermore, the inner polished surface of cooling chamber 103 may be replaced by the heat flux plate 119(b).

Figure 5:
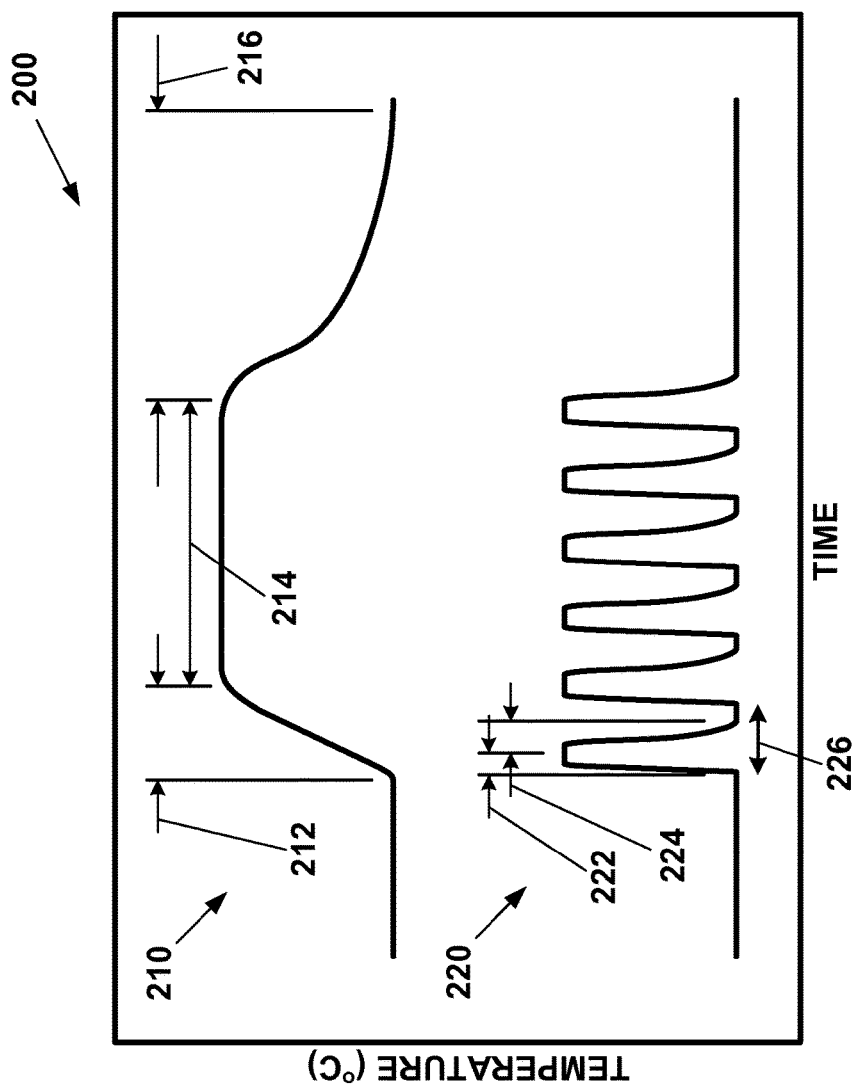
FIG. 5 provides a schematic illustration of an anneal temperature recipe according to various embodiments.

Annealing systems 50, 100 may be operable for magnetic and non-magnetic annealing of workpieces. The anneal process condition, including the anneal temperature recipe, is selected depending on the desired film properties of layers to be annealed on the workpiece. Referring now to FIG. 5, several anneal temperature recipes 200 are illustrated for achieving the desired result. For example, the anneal temperature recipe may include a continuous anneal sequence 210 or a pulsed anneal sequence 220.

In the continuous anneal sequence 210, the anneal temperature recipe includes ramping the temperature from ambient temperature (or a system idle or another elevated temperature) to a first anneal temperature during a first time duration 212, maintaining the first anneal temperature for a second time duration 214, and ramping down the temperature from the first anneal temperature to a reduced temperature at or above the ambient temperature during a third time duration 216. The continuous anneal sequence 210 may further include an anneal temperature recipe that additionally ramps the temperature from the first anneal temperature to a second anneal temperature during a fourth time duration, and maintains the second anneal temperature for a fifth time duration.

In the pulsed anneal sequence 220, the anneal temperature recipe includes rapidly ramping up the temperature from ambient temperature (or a system idle or another elevated temperature) to a first anneal temperature during a first time duration 222, rapidly ramping down the temperature from the first anneal temperature to a reduced temperature at or above the ambient temperature during a second time duration 224, and optionally repeating the rapidly ramping up the temperature and rapidly ramping down the temperature for one or more anneal temperature cycles 226.

In an exemplary embodiment, a method for annealing workpieces at a certain temperature so as to orient the crystals in a specific direction is contemplated. Workpieces 55, 104 are placed onto a rack in process chamber 101 in a predetermined environment, and the element chamber 102 is evacuated such that gaseous conductive heat transfer is reduced. Generally, the pressure in the element chamber 102 is set between $10^{-4}$ and $10^{-2}$ Torr. The workpieces 55, 104 are held at a predetermined temperature, while a magnetic field is optionally applied via magnet system 109. For example, the optionally imposed magnetic field may have a field strength of approximately 0.05 T to approximately 7 T, e.g., 1 T. This latter step is commonly referred to as a "soaking" step.

Thereafter, a flow of cooling fluid is introduced into the element chamber 102, such that the absolute pressure is raised to a low grade vacuum. The flow of gas into element chamber 102 is initiated to achieve the desired cooling effect (i.e., heat transfer from the workpieces 55, 104, via the element chamber 102 to the cooling fluid in the cooling chamber 103). Cooling of element chamber 102, in turn, allows the workpieces 55, 104 to attain a temperature sufficiently low to allow their removal from the annealing system 100. An exemplary anneal process condition associated with magnetic annealing may include a continuous anneal sequence as follows: (i) heating the workpieces 55, 104 to 300 degrees C. for about forty five minutes; (ii) soaking the workpieces 55, 104 for two hours at 300 degrees C.; and (iii) cooling the workpieces 55, 104 to about 100 degrees C. over about seventy minutes.

Figure 6:
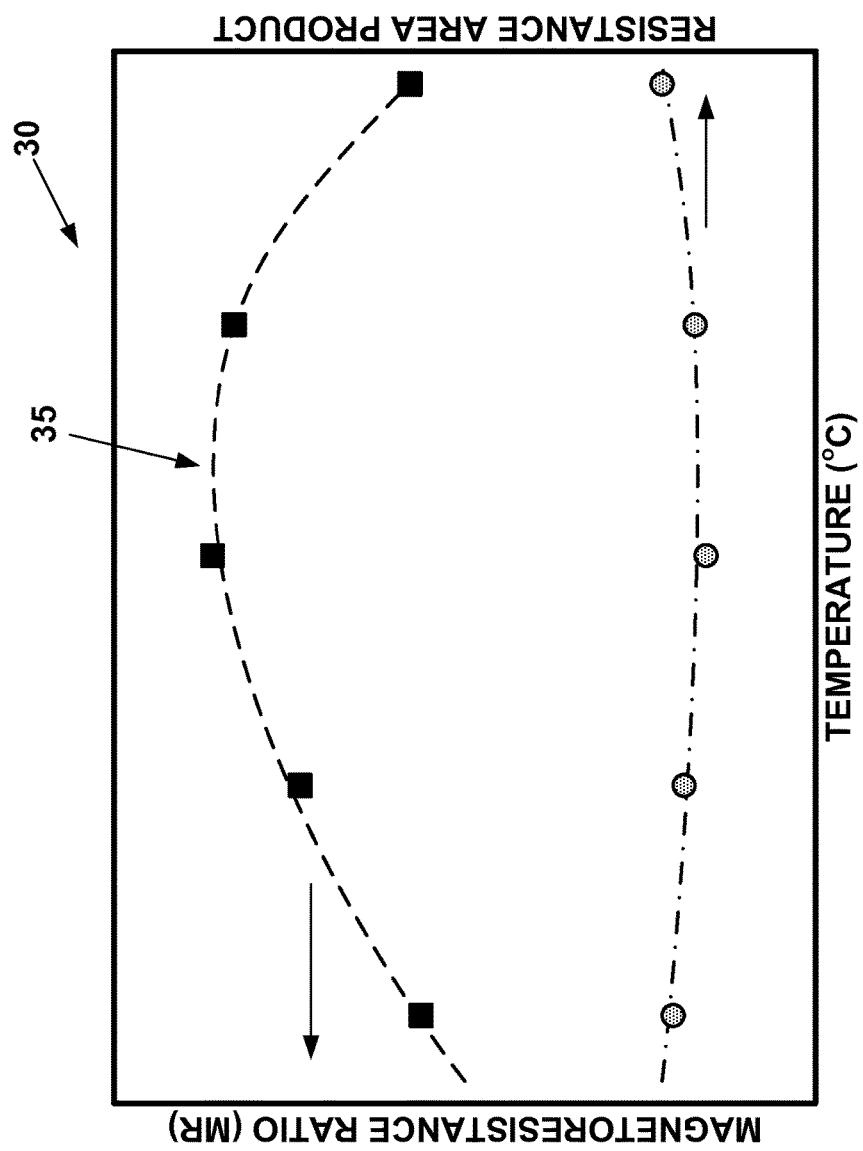
FIG. 6 provides exemplary data illustrating the dependence of MR and resistance area product on anneal temperature.

In some embodiments, the anneal process condition may be selected or optimized to achieve a peak MR in the patterned layer containing magnetic material. For example, as shown in FIG. 6, the MR and resistance area product may be measured as a function 30 of the anneal temperature, while holding other process parameters in the anneal process condition constant, and a peak or optimal MR 35 may be identified.

When executing such an anneal process condition according to the sequence described in FIG. 2, i.e., post-etch/patterning of the multilayer stack, an acceptable MR can be achieved and the deleterious effects of etch damage during patterning of the multilayer stack may be mitigated. In one embodiment, the annealing method may achieve a peak MR in the patterned layer containing magnetic material for a cell CD at or below, for example, 45 nm (nanometers) that is at or above 50% a reference MR achievable in a blanket film of the layer containing magnetic material using an anneal process condition optimized for the blanket film to maximize the MR ratio. In another embodiment, the annealing method may achieve a peak MR in the patterned layer containing magnetic material for a cell CD at or below, for example, 45 nm (nanometers) that is at or above 80% a reference MR achievable in a blanket film of the layer containing magnetic material using an anneal process condition optimized for the blanket film to maximize the MR ratio. In yet other embodiments, the peak MR achieved for a cell CD at or below 45 nm is at or above a threshold value that ranges from 50% to 80%. It is important to note that the anneal process condition that is optimal for a patterned layer may be different than the anneal process condition that is optimal for a blanket layer.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for performing post-etch annealing of a workpiece in an annealing system, comprising:

patterning one or more workpieces, each of said one or more workpieces having a multilayer stack of thin films that has been patterned using an etching process sequence to form an electronic device characterized by a cell critical dimension (CD) at or below 45 nanometers (nm), wherein said multilayer stack of thin films includes at least one patterned layer containing magnetic material, wherein said layer containing magnetic material includes a blanket film having a predetermined magnetoresistance ratio (MR);

disposing, after said patterning is completed, said one or more patterned workpieces in an annealing system; and annealing, in said annealing system after said disposing said one or more patterned workpieces, said at least one patterned layer containing magnetic material on said one or more workpieces disposed in said annealing system via anneal process conditions that include (1) elevating a temperature of said one or more workpieces relative to ambient temperature for an anneal time period according to an anneal temperature recipe specifying one or more predetermined temperature changes, and (2) exposing said one or more workpieces to a magnetic field during at least part of the anneal time period according to an anneal magnetic field recipe specifying a predetermined magnetic field strength, wherein said anneal process conditions are selected to adjust a property of said at least one patterned layer containing magnetic material, achieving a peak MR in said at least one patterned layer containing magnetic material for the cell CD at or below 45 nm (nanometers) as a result of said annealing, the peak MR being at or above 50% of the predetermined MR of the blanket film of said layer containing magnetic material, wherein said anneal temperature recipe is a continuous anneal sequence that includes ramping said temperature from ambient temperature to a first anneal temperature during a first time duration, maintaining said first anneal temperature for a second time duration consecutive to the first time duration, ramping said temperature from a first anneal temperature to a second anneal temperature during a third time duration consecutive to the second time duration, and maintaining said second anneal temperature for a fourth time duration consecutive to the third time duration, wherein the magnetic field is applied to said one or more patterned workpieces during at least the second and fourth time durations;

wherein said annealing further comprises:

sealing said one or more workpieces in a process chamber of said annealing system, and evacuating said process chamber to a reduced pressure relative to ambient pressure;

energizing one or more arrays of heating elements according to said anneal temperature recipe, said one or more arrays of heating elements being disposed in said annealing system and arranged to surround said process chamber; and cooling said one or more workpieces in the process chamber of said annealing system at a temperature lower than the second anneal temperature during a fifth time duration, and wherein in at least one region within the annealing system a pressure during cooling in the fifth time duration is higher than during the fourth time duration.

2. The method of claim 1, wherein said property of said at least one patterned layer containing magnetic material that is adjusted by the anneal process conditions includes crystallization, uniaxial anisotropy, magnetoresistance (MR) ratio, or resistance area product, or a combination of two or more thereof.

3. The method of claim 1, wherein said at least one patterned layer containing magnetic material is composed of a substantially amorphous phase material following said etching process sequence and prior to said annealing.

4. The method of claim 1, wherein said electronic device comprises a memory cell having layers containing magnetic material for either a basis of its information storage or switching of its memory state(s), the electronic device further including magnetoresistive random access memory (MRAM), current switching toggle magnetic structures, magnetic tunnel junction (MTJ) devices, spin torque transfer (STT) devices, spin valves, and pseudo-spin valves.

5. The method of claim 1, wherein the achieved peak MR is at or above 80% of the predetermined MR of the blanket film of said layer containing magnetic material.

6. The method of claim 1, wherein said elevating a temperature of said one or more workpieces according to said anneal temperature recipe includes elevating said one or more workpieces to a peak temperature ranging from about 200 degrees C. to about 600 degrees C.

7. The method of claim 1, wherein said elevating a temperature of said one or more workpieces according to said anneal temperature recipe includes elevating said one or more workpieces to a peak temperature ranging from about 250 degrees C. to about 350 degrees C.

8. The method of claim 1, wherein said anneal time period ranges up to about 100 hours.

9. The method of claim 1, wherein said anneal time period ranges from about 1 second to about 10 hours.

10. The method of claim 1, wherein the magnetic field has a predetermined magnetic field strength having a field strength ranging up to 5 T.

11. The method of claim 1, further comprising:
flowing a process gas into said process chamber during said annealing.

12. The method of claim 1, wherein the magnetic field has a field strength ranging up to 5 T.

13. The method of claim 1, further comprising:
energizing a magnet system disposed in said annealing system and arranged around or adjacent said process chamber, said magnet system including a superconducting magnet, an electromagnet, or a permanent magnet, or a combination of two or more thereof.

14. A method for performing post-etch annealing of a workpiece in annealing system, comprising:

performing an etching process sequence that is used to pattern a multilayer stack of thin films on a workpiece that includes a patterned layer containing magnetic material to form an electronic device characterized by a cell critical dimension (CD) at or below 45 nanometers (nm), wherein said layer containing magnetic material includes a blanket film having a predetermined magnetoresistance ratio (MR), after said etching process sequence is completed, disposing said patterned workpiece in said annealing system; and after said patterned workpiece is disposed in said annealing system, annealing said patterned layer containing magnetic material to transition a composition of said patterned layer containing magnetic material from a substantially amorphous phase to a substantially crystalline phase, and produce a desired anisotropy direction in or at a surface of said patterned layer containing magnetic material, wherein, said annealing includes (i) exposing said patterned workpiece to a magnetic field according to an anneal magnetic field recipe specifying a predetermined magnetic field strength, and (ii) elevating a temperature of said patterned workpiece relative to ambient temperature for an anneal time period according to an anneal temperature recipe specifying one or more predetermined temperature changes, achieving a peak MR in said at least one patterned layer containing magnetic material for the cell CD at or below 45 nm (nanometers) as a result of said annealing, the peak MR being at or above 50% of the predetermined MR of the blanket film of said layer containing magnetic material, wherein said anneal temperature recipe is a continuous anneal sequence that includes ramping said temperature from ambient temperature to a first anneal temperature during a first time duration, maintaining said first anneal temperature for a second time duration consecutive to the first time duration, ramping said temperature from the first anneal temperature to a second anneal temperature during a third time duration consecutive to the second time duration, and maintaining said second anneal temperature for a fourth time duration consecutive to the third time duration, wherein the magnetic field is applied to said one or more patterned workpieces during at least the second and fourth time durations;

wherein said annealing further comprises:
sealing said one or more workpieces in a process chamber of said annealing system, and evacuating said process chamber to a reduced pressure relative to ambient pressure;
energizing one or more arrays of heating elements according to said anneal temperature recipe, said one or more arrays of heating elements being disposed in said annealing system and arranged to surround said process chamber; and
cooling said one or more workpieces in the process chamber of said annealing system at a temperature lower than the second anneal temperature during a fifth time duration, and wherein in at least one region within the annealing system a pressure during cooling in the fifth time duration is higher than during the fourth time duration.

15. The method according to claim 1, wherein said second anneal temperature is greater than 350 degrees C. and less than 600 degrees C.

16. The method of claim 1, wherein the annealing system includes a heat flux plate between the one or more arrays of heating elements, and wherein the process chamber includes a chamber wall between the heat flux plate and the one or more workpieces in the process chamber; and
wherein the disposing of the one or more workpieces in the annealing system includes disposing one or more workpieces inside the chamber wall which have a thermal mass greater than each of: (1) a thermal mass of the heat flux plate, (2) a thermal mass of the one or more arrays of heating elements, and (3) a thermal mass of the chamber wall between the heat flux plate and the one or more workpieces.

17. The method of claim 1, wherein the one or more arrays of heating elements are provided between a first heat flux plate and a second heat flux plate, wherein the first heat flux plate has an emissivity higher than the second heat flux plate, the first heat flux plate is positioned between the one or more arrays of heating elements and a wall of the processing chamber, and the second heat flux plate is positioned between the one or more arrays of heating elements and a magnet system which provides the magnetic field; and
the method further comprises providing a first heat transfer fluid into an element chamber which contains the first and second heat flux plates and the one or more arrays of heating elements, and providing a second heat transfer fluid in a jacket surrounding the element chamber.

18. The method of claim 17, wherein the at least one region within the annealing system which has a higher pressure during cooling in the fifth time duration than during the fourth time duration includes a region within the element chamber.

19. The method of claim 18, wherein the first heat transfer fluid is a gaseous heat transfer fluid and the second heat transfer fluid is a liquid heat transfer fluid, and wherein pressures within the element chamber during both the fifth time duration and the fourth time duration are below ambient pressure.

20. The method of claim 19, wherein a plurality of workpieces are provided as a stack within the process chamber, and wherein the one or more arrays of heating elements include: (1) one or more first heating elements surrounding a center region of the stack with respect to a vertical direction, (2) one or more second heating elements positioned above the one or more first heating elements, and (3) one or more third heating elements positioned below the one or more first heating elements, and
wherein the method further includes controlling the one or more first heating elements independently from the one or more second heating elements and the one or more third heating elements.

* * * * *